(12) United States Patent
Tsai et al.

(10) Patent No.: US 6,991,533 B2
(45) Date of Patent: Jan. 31, 2006

(54) FLOW DIRECTION CONTROL MECHANISM

(75) Inventors: I-Hsuan Tsai, Kaohsiung (TW); Chao-Wu Wen, Nei-Li (TW); Wen-Shi Huang, Chung-Li (TW); Te-Tsai Chuang, Miao-Li (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 0 days.

(21) Appl. No.: 10/370,406

(22) Filed: Feb. 19, 2003

(65) Prior Publication Data

US 2003/0224717 A1    Dec. 4, 2003

(30) Foreign Application Priority Data

May 29, 2002    (TW)    ............................... 91111402 A (51) Int. Cl.
*H05K 7/20*    (2006.01)
(52) U.S. Cl. ...................................... 454/184; 361/695
(58) Field of Classification Search ............... 454/184, 454/338, 341; 361/695
See application file for complete search history.

(56) References Cited

U.S. PATENT DOCUMENTS

| | | | | |
|---|---|---|---|---|
| 4,648,007 A | * | 3/1987 | Garner ........................ | 361/695 |
| 5,890,959 A | * | 4/1999 | Pettit et al. .................. | 454/184 |
| 6,005,770 A | | 12/1999 | Schmitt | |
| 6,115,250 A | * | 9/2000 | Schmitt ....................... | 361/695 |
| 6,135,875 A | * | 10/2000 | French ........................ | 454/184 |
| 6,174,232 B1 | * | 1/2001 | Stoll et al. ................... | 454/184 |
| 6,181,557 B1 | * | 1/2001 | Gatti ........................... | 361/695 |
| 6,217,440 B1 | * | 4/2001 | Wessel et al. ................ | 454/184 |
| 6,554,698 B2 | * | 4/2003 | Kranzdorf et al. .......... | 454/184 |
| 6,688,965 B1 | * | 2/2004 | Crippen et al. ............. | 454/184 |

\* cited by examiner

*Primary Examiner*—Harold Joyce
(74) *Attorney, Agent, or Firm*—Birch, Stewart, Kolasch & Birch, LLP (57) ABSTRACT

A flow direction control mechanism is provided, which includes at least a rotatable means provided in a passage of an electronic system or apparatus. The rotatable means moves to an open position by means of a force generated from fluids flowing through the passage and returns to a close position in the absence of the force. Further, a restrictor is disposed adjacent to the rotatable means for restricting movement of the rotatable means between the open position and the close position.

13 Claims, 9 Drawing Sheets

FLOW DIRECTION CONTROL MECHANISM

FIELD OF THE INVENTION

The present invention relates to flow direction control mechanisms, and more particularly, to a flow direction control mechanism installed in a passage of a system or a device for controlling the airflow direction and eliminating the occurrence of reverse flow or air turbulence.

BACKGROUND OF THE INVENTION

Modern electronic devices such as computers and mobile phones are developed with advancement of technology and have central process units (CPUs) thereof to be more efficient in arithmetic calculation, thereby producing more heat during operation of the electronic devices and making heat dissipation or temperature control more significantly concerned for the electronic devices. For example, it is critical to prevent electromigration effect that is induced by temperature rising above a threshold and causes a malfunction or breakdown of the electronic devices. Besides, heat dissipation plays an important role in system stability of CPUs in computers or other electronic devices; therefore, one main problem to be solved is to enhance heat dissipating efficiency in order to improve system performance.

For solving ventilation, convection and heat dissipation problems in computers, electrical and mechanical apparatuses, power suppliers, air-conditioning devices and other industrial appliances, it is general to install heat dissipating devices such as axial fans, centrifugal fans and other fans to direct airflow into a particular passage and to thereby dissipate the airflow together with heat generated from the electronic devices to the outside or atmosphere, so as to achieve heat dissipation and ventilation purposes.

Figure 7A:
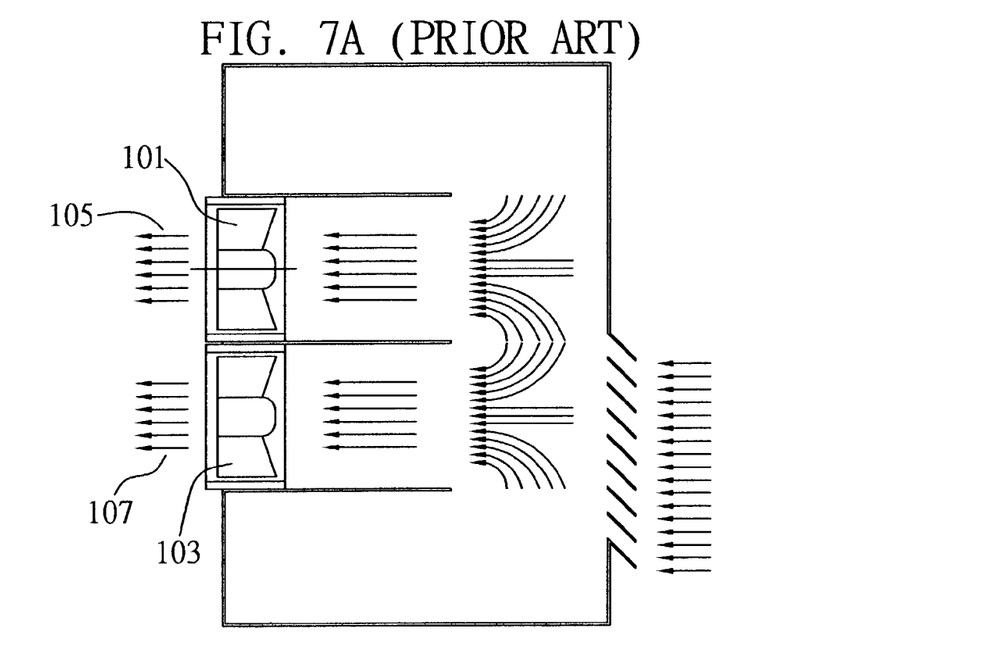
FIG. 7A (PRIOR ART) is a side view of a conventional electronic device for heat dissipation and air conditioning.
Figure 7B:
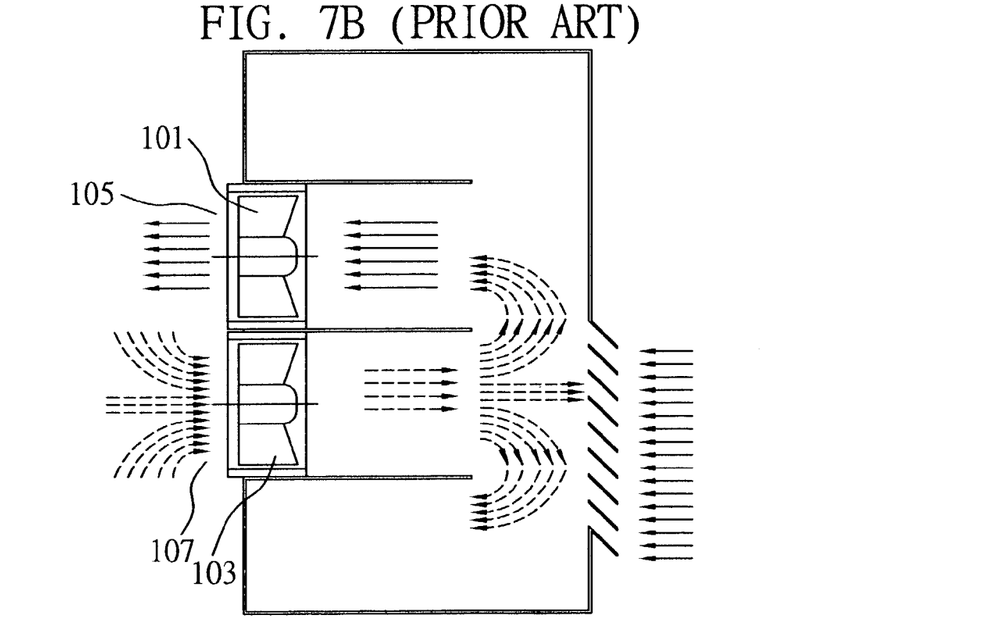
FIG. 7B (PRIOR ART) is a schematic view of a conventional electronic device for heat dissipation and air conditioning with a breakdown of one fan.

As shown in FIGS. 7A and 7B that respectively illustrate a side view of a conventional electronic device for heat dissipation or air conditioning, a first fan 101 and a second fan 103 are mounted in a passage of the electronic device and used to exhaust air in the passage via air outlets 105, 107.

As shown in FIG. 7A, when the first fan 101 and the second fan 103 both operate normally, they can direct air in the passage to be exhausted via the air outlets 105, 107.

However, in the case of a breakdown of any one of the two fans, for example, the second fan 103 failing to operate properly and only the first fan 101 functioning normally, air can freely pass through the air outlet 107 that is connected to the second fan 103, which may cause reverse airflow as indicated by dotted arrows in FIG. 7B. Besides the reverse airflow, it also seriously affects exhaust of inner air in the passage or even affects operation of the first fan 101, making heat dissipating efficiency of the electronic device undesirably reduced; this problem would be more sever in an electronic device with an advanced CPU that is in high demand of heat dissipation.

In response to the above heat dissipation problem induced by malfunctioning of a heat dissipating mechanism of the electronic device, a solution is to install a compensation mechanism for improving power of the heat dissipating mechanism; that is, if one of the fans fails to function properly, the compensation mechanism operates to elevate power of the other normally-functioning fans to maintain heat dissipating efficiency of the heat dissipating mechanism by means of forced convection for exhaust or convection of inner air in the electronic device.

However, provision of the compensation mechanism would increases fabrication costs and structural complexity; as it needs to take a period of time for the compensation mechanism to detect and react to malfunctioning of the fan, the electronic device may be broken down due to high temperature before an action or response is made by the compensation mechanism.

Moreover, as the fans are directly connected with air inlets or air outlets, reverse airflow occurs in a breakdown of the malfunctioning fan and also affects operation of other normally-functioning fans by which efficiency of convection or heat dissipation is significantly reduced, thus increasing load of the compensation mechanism and making the compensation mechanism easily damaged.

Therefore, the problem to be solved herein is to provide a flow direction control mechanism that can solve the foregoing drawbacks without significantly increasing fabrication costs.

SUMMARY OF THE INVENTION

A primary objective of the present invention is to provide a flow direction control mechanism in a passage of an electronic device for controlling a flow direction of airflow.

Another objective of the invention is to provide a flow direction control mechanism for controlling and preventing reverse airflow and for improving convection and heat dissipating efficiency in a passage of an electronic device.

In order to achieve the foregoing and other objectives, the present invention provides a flow direction control mechanism including a rotatable means mounted in a passage of an electronic device, wherein the rotatable means moves to an open position by means of a force generated from airflow flowing through the passage in operation of a heat dissipating device in the electronic device, and the rotatable means returns to a close position without requiring an external force. Further, a restricting means or restrictor may be mounted close to the rotatable means for restricting movement of the rotatable means between the open position and the close position, so as to control a flowing direction of airflow in the passage and prevent reverse airflow to thereby improve convection and heat dissipating efficiency.

The above flow direction control mechanism may be optionally and flexibly mounted at an air inlet or air outlet in the passage of the electronic device, and/or at positions near an air inlet or air outlet of a heat dissipation device in the electronic device. And, a plurality of the flow direction control mechanisms may be simultaneously mounted at suitable positions in the passage of the electronic device, so as to achieve desirable controlling effect on airflow in the passage.

The rotatable means may be made of a light material such as Mylar, polyester, acrylic plastic, fiber glass, resin, metal, or polycarbonate, which can be driven by the force generated from airflow movement. Surfaces of the rotatable means may be declined to allow the rotatable means to easily open or move to the open position by means of the airflow-induced force and to close or return to the close position due to gravity.

The rotatable means installed in the passage may be adapted to move in a linear or rotational motion. And, a bias means may be further provided for the rotatable means; in the absence of the airflow-induced force, the bias means provides biasing effect to allow the rotatable means to return to the close position.

Moreover, size, number and shape of the rotatable means and restrictor may be flexibly designed according to the structure of the passage. And, a plurality of the flow direction control mechanisms may be integrated as a module type to be detachably mounted at suitable positions in the passage of the electronic device, so as to desirably achieve airflow control improvement without significantly increasing fabrication costs of the flow direction control mechanism.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF PREFERRED EMBODIMENTS

The preferred embodiments of a flow direction control mechanism proposed in the present invention are described in detail as follows with reference to FIGS. 1 to 6.

First Preferred Embodiment

Figure 1A:
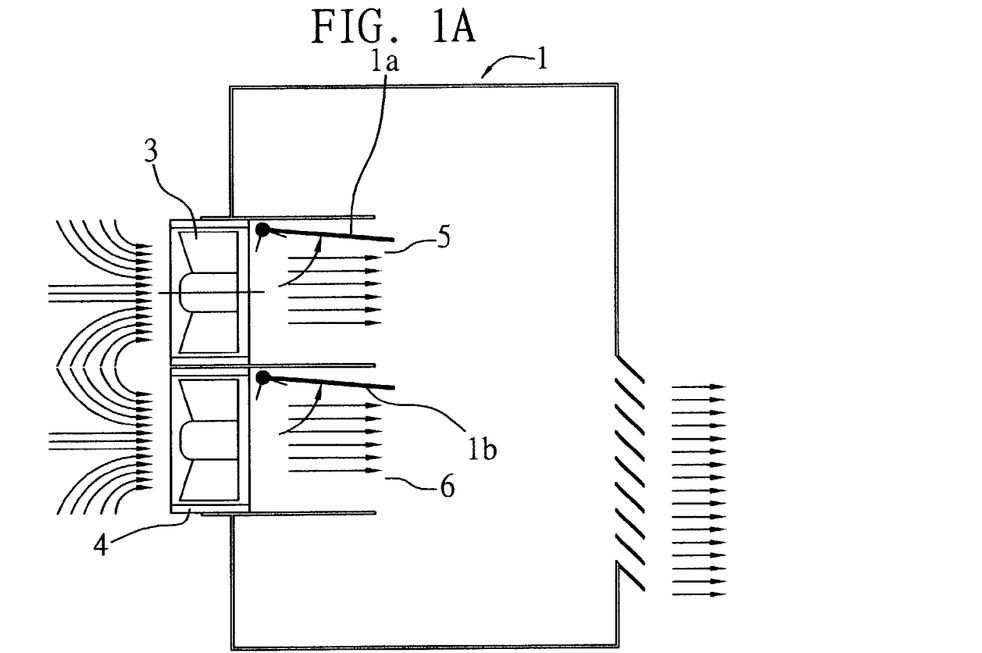
FIG. 1A is a side view of a flow direction control mechanism according to a first embodiment of the invention.
Figure 1B:
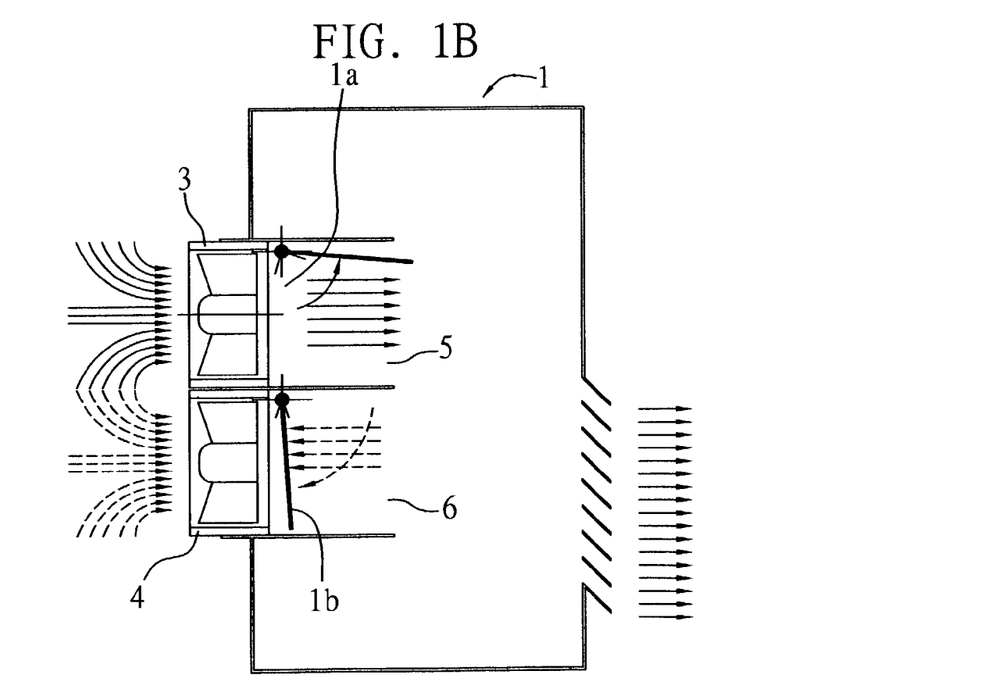
FIG. 1B is a side view of the flow direction control mechanism according to the first embodiment of the invention with a breakdown of one heat dissipating device.

FIGS. 1A and 1B illustrate a flow direction control mechanism according to a first embodiment of the invention. A pair of these flow direction control mechanisms 1 having rotatable means 1a, 1b are disposed at air inlets 5, 6 of a passage of an electronic device and at inner positions with respect to heat dissipating devices 3, 4.

The rotatable means 1a, 1b can be rotatably mounted to a top, side or bottom wall of the passage of the electronic device, and spaced apart from the heat dissipating devices 3, 4 by a proper distance to avoid undesirably interference.

The heat dissipating devices 3, 4 are each mounted in the passage of the electronic device, and operate to produce airflow for directing air in the passage through air inlets 5, 6 toward outside for exhaust. The heat dissipating devices 3, 4 can be heat dissipating fans such as axial flow fans or centrifugal fans.

As shown in FIG. 1A, when the heat dissipating devices 3, 4 operate properly and respectively direct airflow into the air inlets 5, 6, movement of the airflow generates a pushing force or pressure on the rotatable means 1a, 1b by which the rotatable means 1a, 1b open or move to an open position to thereby allow the airflow to pass through the air inlets 5, 6. In other words, the rotatable means are changed in position by virtue of force or pressure differences so as to control or impede a flow direction of the airflow.

As shown in FIG. 1B, when the heat dissipating device 4 fails to function properly, no airflow is induced and enters the air inlet 6, and thus no force or pressure is applied to the rotatable means 1b, thereby making the rotatable means 1b return to a close position due to gravity.

Moreover, the flow direction control mechanism 1 may be further provided with a positioner or a bias means to help securely hold the rotatable means at the open position or the close position and to eliminate noise generated from the rotatable means by shaking or striking during movement thereof.

Furthermore, the rotatable means can be shaped as a thin plate and pivotally installed in the passage of the electronic device. The rotatable means is preferably made of a light and flexible material such as Mylar, polyester, acrylic-plastic, fiber glass, resin, metal, and polycarbonate, so as to allow airflow to easily pass across the rotatable means.

Second Preferred Embodiment

FIGS. 2A to 2D illustrate a flow direction control mechanism according to a second embodiment of the invention. A pair of these flow direction control mechanisms 11 are disposed at air outlets 15, 16 of the passage of an electronic device and at outer positions with respect to heat dissipating devices 13, 14. The flow direction control mechanisms 11 are formed with rotatable means 11a, 11b and restrictors 11c, 11d, 11e, 11f, wherein the restrictors 11c, 11d, 11e, 11f are each a protrusion formed on an inner side wall of the passage. The rotatable means 11a, 11b of the second embodiment are structured and have the same functions as those in the first embodiment; therefore, no further description thereto is to be here repeated. The second embodiment only differs from the first embodiment in that the rotatable means 11a, 11b are located near the air outlets 15, 16 of the passage and the restrictors 11c, 11d, 11e, 11f are provided.

Figure 2A:
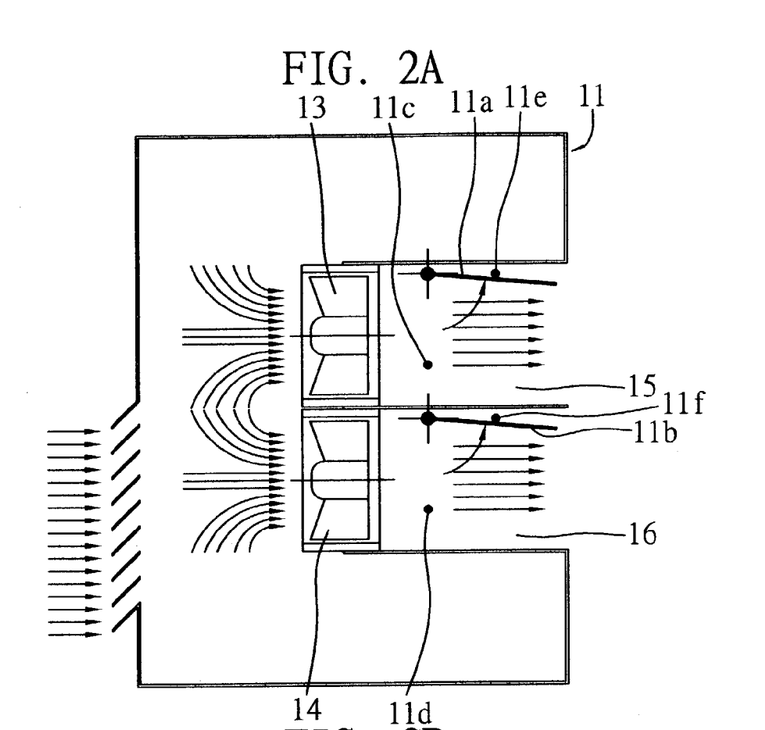
FIG. 2A is a side view of the flow direction control mechanism according to a second embodiment of the invention.
Figure 2B:
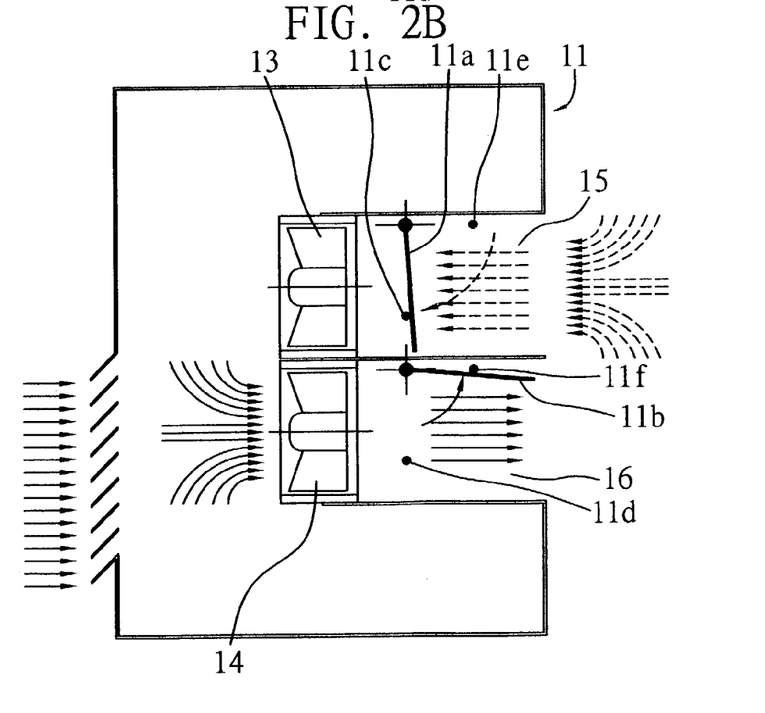
FIG. 2B is a schematic diagram showing the flow direction control mechanism according to the second embodiment of the invention with a breakdown of one heat dissipating device.
Figure 2C:
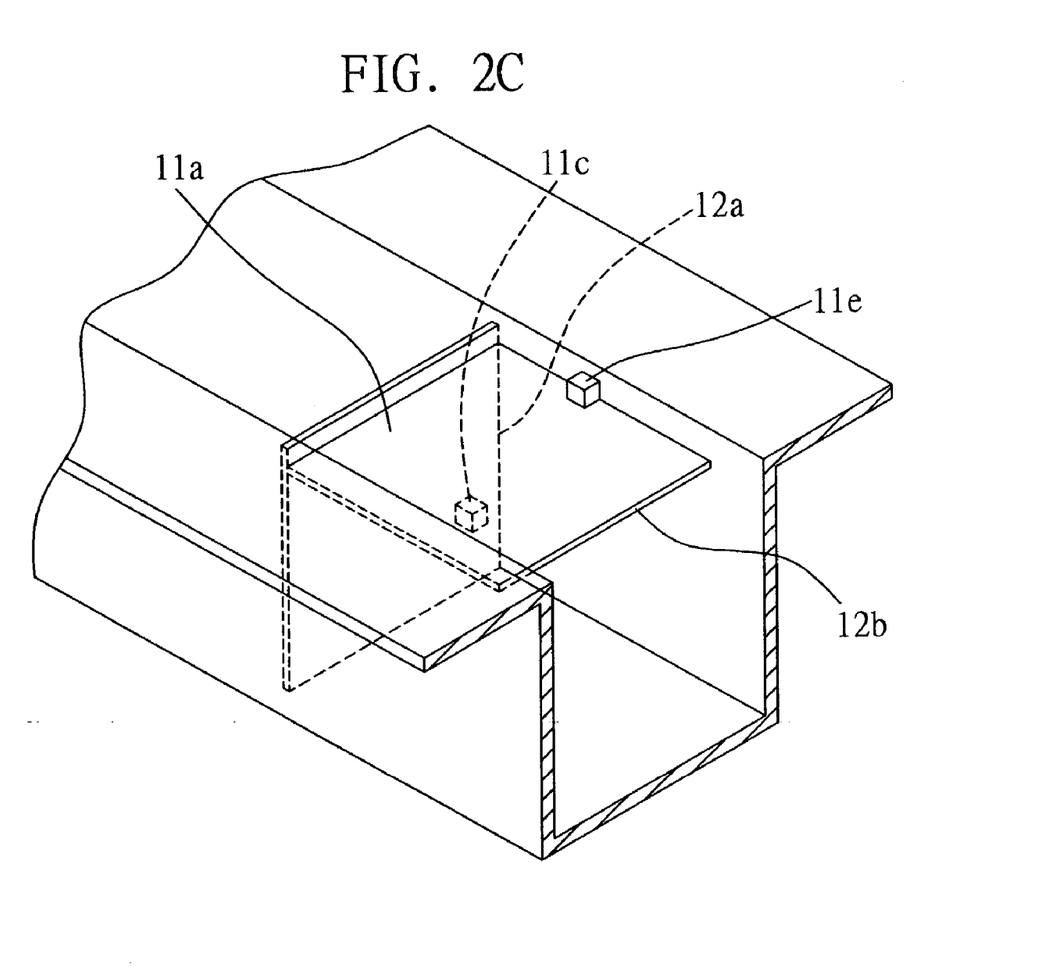
FIG. 2C is a magnified perspective view showing part of the flow direction control mechanism according to the second embodiment of the invention.

As shown in FIG. 2A, when the heat dissipating devices 13, 14 operate properly, airflow in the electronic device is directed through the air outlets 15, 16 toward outside of the passage, and thus generates a pushing force to move the rotatable means 11a, 11b to an open position illustrated in FIG. 2C in which the rotatable means 11a moves from a close position 12a (indicated by dotted lines) to an open position 12b (indicated by solid lines), with the restrictors 11c, 11e being provided for restricting movement of the rotatable means 11a between the close position 12a and the opening position 12b.

Figure 2D:
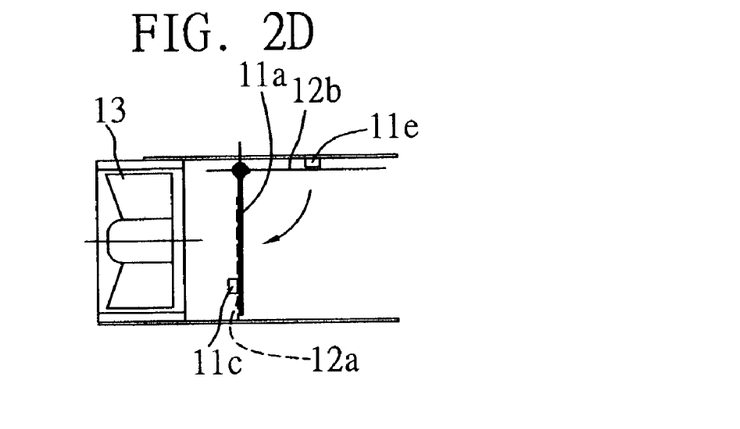
FIG. 2D is a side view showing part of the flow direction control mechanism according to the second embodiment of the invention.

As shown in FIG. 2B, when the heat dissipating device 13 fails to function properly, no airflow is induced and enters the air outlet 15, and thus no force or pressure is applied to the rotatable means 11a, thereby making the rotatable means 11a return to a close position due to gravity; that is, as shown in FIG. 2D, the rotatable means 11a moves from the open position 12b to the close position 12a.

With the heat dissipating device 14 operating normally, the rotatable means 11b opens toward the air outlet 16 or moves from a close position to an open position by means of an outward pushing force generated from outward movement of the airflow in the passage, whereas the rotatable means 11a keeps at the close position to prevent reverse airflow back to the passage. In this case, even with a breakdown of the heat dissipating device 13, air in the passage is still smoothly directed by the heat dissipating device 14 through the air outlet 16 having the rotatable means 11b open for exhaust, and also outside air is blocked by the closed rotatable means 11a and fails to enter through the air outlet 15 into the passage, such that turbulence and reverse flow can be eliminated. And, the restrictors 11d, 11f are provided for restricting movement of the rotatable means 11b between the close position and the opening position.

Moreover, the restrictors 11c–f may be in the form of protrusions, frames, blocks, shafts, pins or other suitable structures to achieve the positionally restricting function. And, besides the inner side wall of the passage shown in FIGS. 2A–2D, the restrictors 11c–f can also be mounted to a bottom wall or top wall of the passage or to any other differently-shaped passage at positions where they can operate to restrict movement of the rotatable means 11a, 11b between the open position and close position. Alternatively, in this embodiment shown in FIGS. 2A–2D, top walls of the air outlets 15, 16 can serve as restrictors for restricting the moving range of the rotatable means 11a, 11b.

Third Preferred Embodiment

Figure 3A:
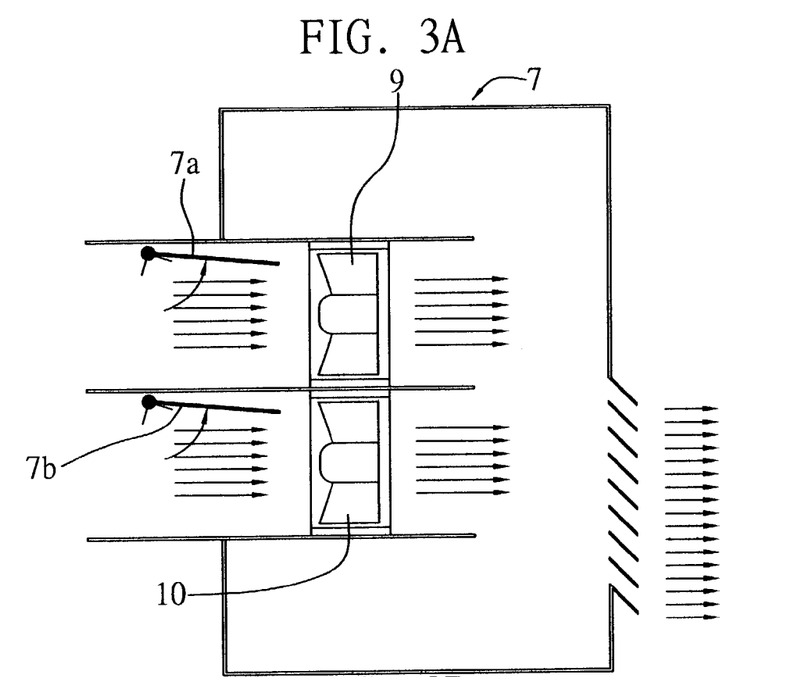
FIG. 3A is a side view of the flow direction control mechanism according to a third embodiment t of the invention.
Figure 3B:
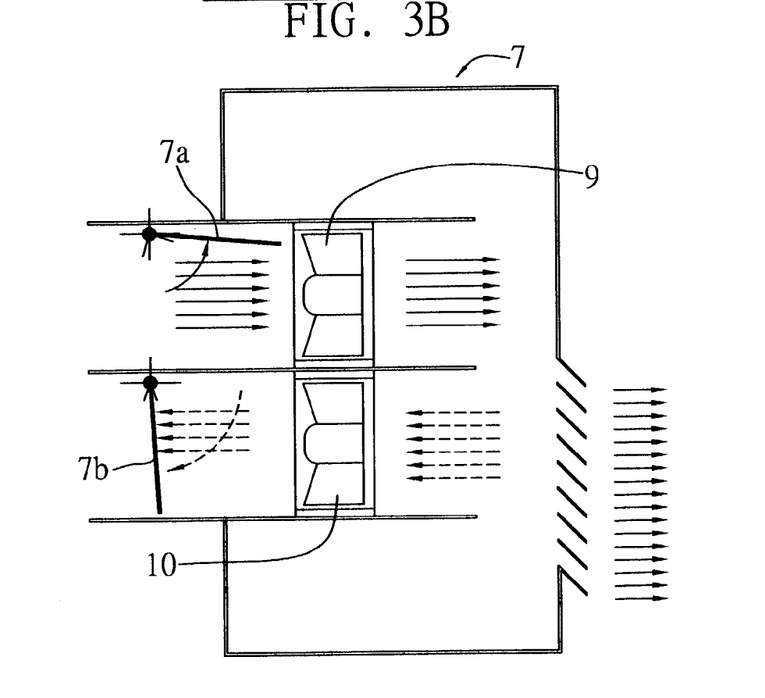
FIG. 3B is a schematic diagram showing the flow direction control mechanism according to the third embodiment of the invention with a breakdown of one heat dissipating device.

FIGS. 3A and 3B illustrate a flow direction control mechanism according to a third embodiment of the invention. This flow direction control mechanism 7 has the structure similar to that of the first embodiment with the only difference in that the flow direction control mechanisms 7 are installed at outside position rather than inner positions (first embodiment) with respect to heat dissipating devices 9, 10.

Fourth Preferred Embodiment

Figure 4:
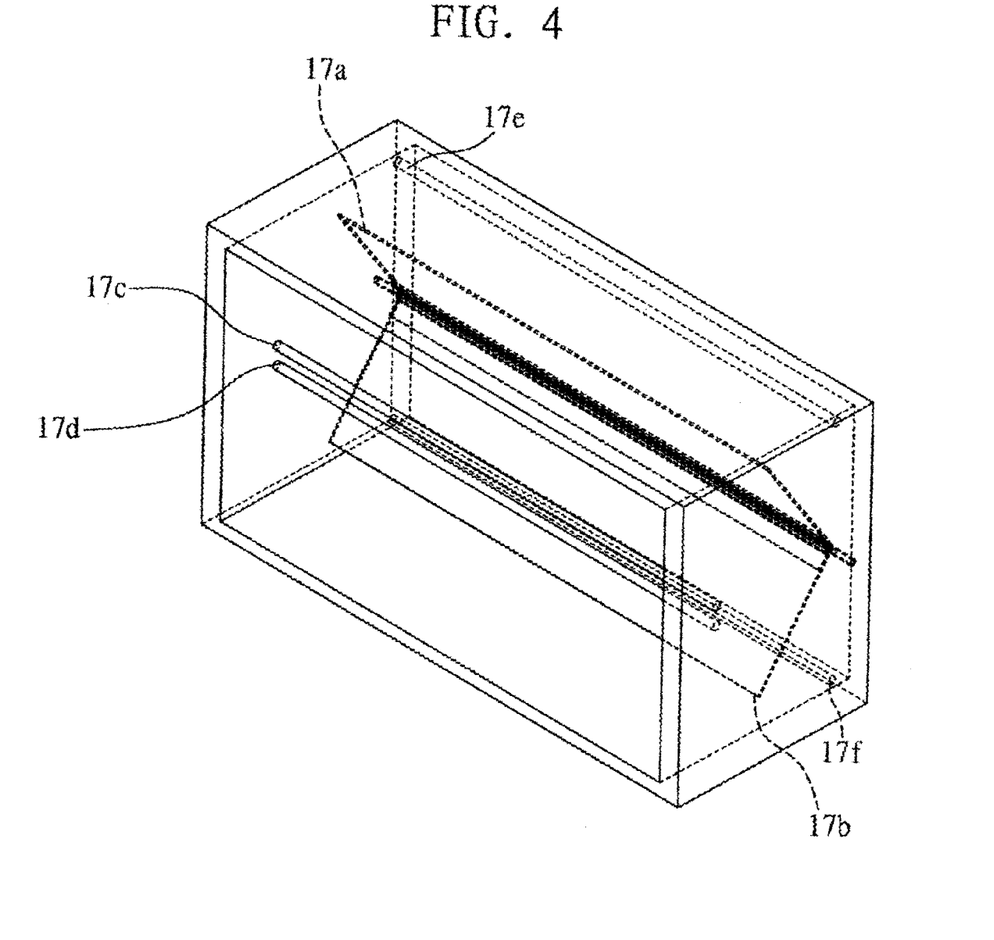
FIG. 4 is a perspective view showing arrangement of rotatable means according to a fourth embodiment of the invention.

FIG. 4 illustrates a flow direction control mechanism according to a fourth embodiment of the invention. A pair of these flow direction control mechanisms 17 are disposed at air outlets of the passage of the electronic device, and formed with rotatable means 17a, 17b and restrictors 17c, 17d, each restrictor 17c, 17d being formed as a pair of shafts.

These rotatable means and restrictors have the same functions as those in the foregoing embodiments, and thus no further description thereto is to be here repeated only.

As shown in FIG. 4, the flow direction control mechanism 17 of the fourth embodiment differs from the above embodiments in that the rotatable means 17a, 17b are coaxially connected and mounted in the passage of the electronic device and spaced apart from a heat dissipating device (not shown) provided in the passage by a proper distance to avoid undesirable interference. The restrictors 17c, 17d, 17e, 17f are individually mounted on an inner side wall of the passage for restricting movement of the rotatable means 17a, 17b only between an open position and a close position.

In other words, when the rotatable means 17a, 17b each moves to the open position, the restrictors 17c, 17d prevent the rotatable means 17a, 17b from coming into contact or colliding with each other; when the rotatable means 17a, 17b each moves to the close position, the restrictors 17e, 17f installed on the side wall of the passage prevent the rotatable means 17a, 17b from moving beyond the close position, such that the rotatable means 17a, 17b would not move toward or get into contact with the heat dissipating device in the passage. The restrictors 17c, 17d, 17e, 17f may be in the form of railings, leads, gates or other suitable structures to provide the positional restricting function.

Moreover, the rotatable means 17a, 17b may be integrally shaped as a single rotatable means that is centrally bent by a suitable angle and operates to move between an open position and an close position, wherein a biasing means, positioner or other equivalent elements may also be provided for positioning purposes.

Fifth Preferred Embodiment

Figure 5A:
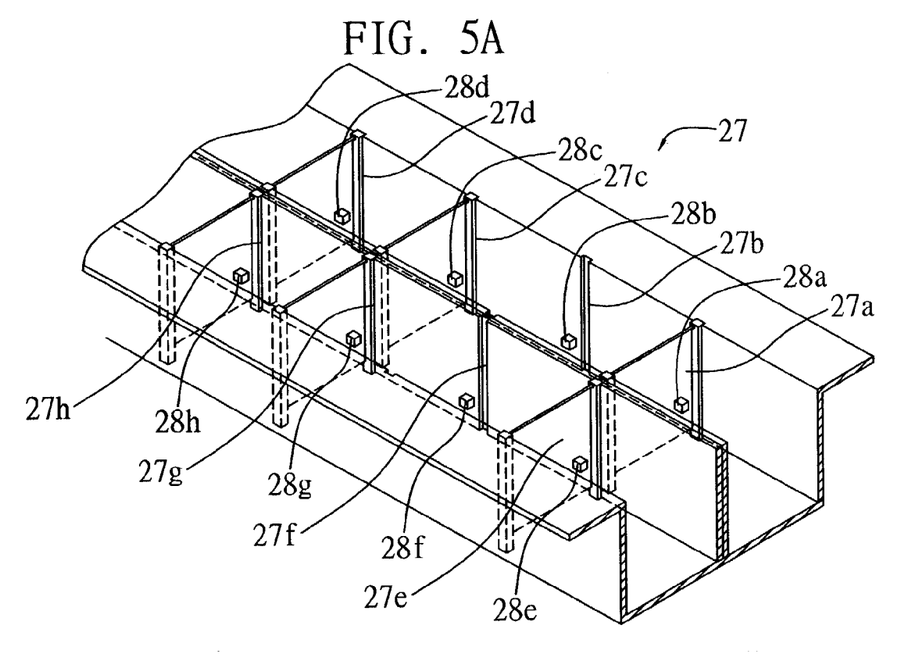
FIG. 5A is a perspective view of the flow direction control mechanism according to a fifth embodiment of the invention.
Figure 5B:
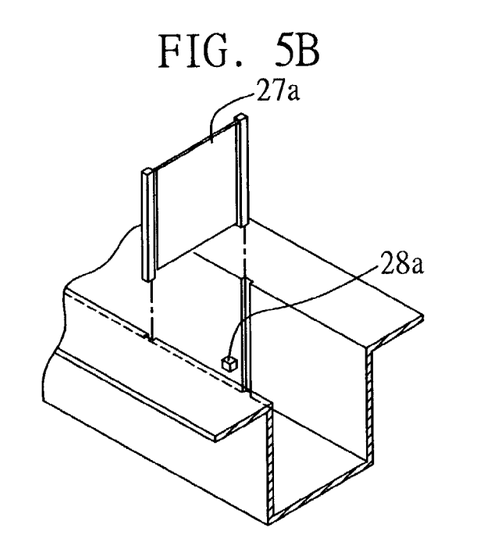
FIG. 5B is a schematic view showing part of the flow direction control mechanism according to the fifth embodiment of the invention.

FIGS. 5A and 5B illustrate a flow direction control mechanism according to a fifth embodiment of the invention. As shown in FIG. 5A, a pair of these flow direction control mechanisms 27 are installed in the passage of the electronic device, and provided with rotatable means 27a, 27e, a plurality of restrictors 28a, 28e, 28c, 28d, 28b, 28f, 28g, 28h and a plurality of predetermined positions 27b, 27c, 27d, 27f, 27g, 27h for disposing the rotatable means 27a, 27e.

The flow direction control mechanism 27 of this embodiment differs the foregoing embodiments in that this flow direction control mechanism 27 is formed in a module type and can be detachably mounted to one or more suitable positions in the passage of the electronic device. As shown in the drawings, a plurality of predetermined positions 27b, 27c, 27d, 27f, 27g, 27h are provided for accommodating a plurality of rotatable means simultaneously and for easily renewing or replacing damaged rotatable means.

Alternatively, the rotatable means may be integrally formed in the passage of the electronic device and properly spaced apart from the heat dissipating devices (not shown) to be mounted in the passage, and the number of rotatable means and restrictors can vary optionally to allow the rotatable means not to come into contact with the heat dissipating devices during movement between an open position and a close position.

Besides, in accordance with an amount of airflow, arrangement of the heat dissipating devices or other practical requirements, the rotatable means can be flexibly installed at any one or more of the predetermined positions 27b, 27c, 27d, 27f, 27g, 27h. For examples, when the airflow amount is large or increases, more rotatable means are preferably utilized, or the rotatable means may be provided at positions relatively more distant to the heat dissipating devices; when the airflow amount is small or reduces, the number of rotatable means may be decreased, the rotatable means can be installed at positions relatively closer to the heat dissipating devices, or damaged rotatable means if any can be renewed.

The rotatable means installed in the passage of the electronic device may be adapted to move in a linear, rotational or another type motion to the open position by means of a force generated from airflow flowing through the passage and return to the close position by means of a force or pressure difference. And, the restrictors are provided to restrict movement of the rotatable means only between the open position and the close position.

Moreover, besides detachable mounting shown in FIGS. 5A and 5B, the rotatable means may have elasticity and can be pivotally mounted in the passage of the electronic device.

Sixth Preferred Embodiment

Figure 6A:
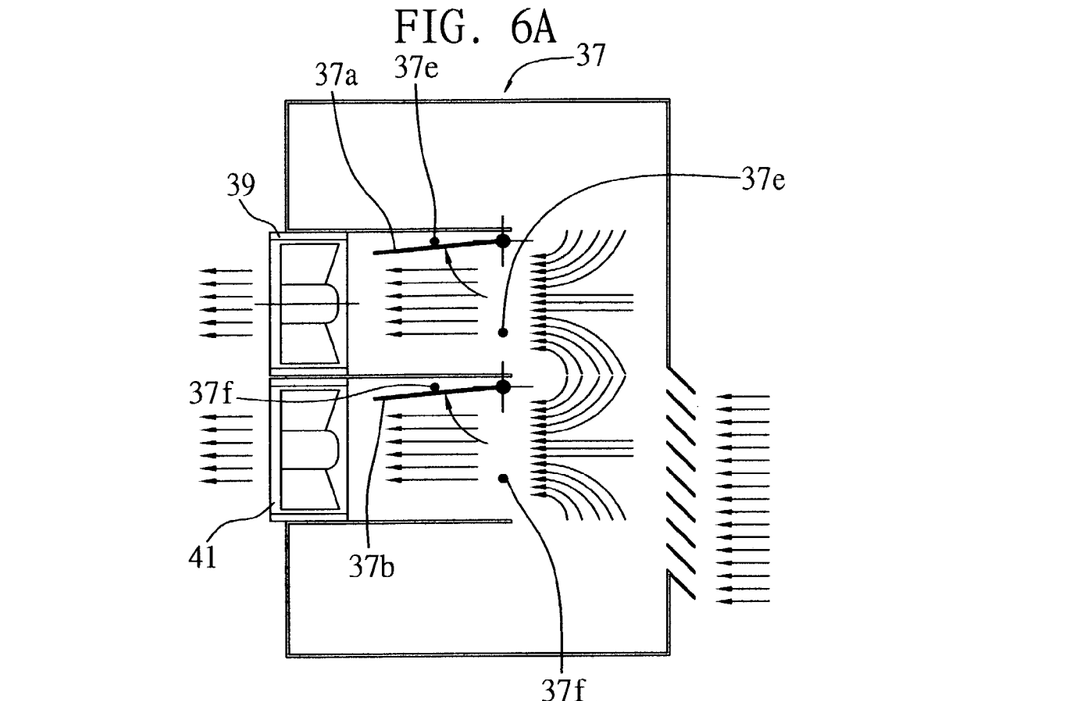
FIG. 6A is a side view of the flow direction control mechanism according to a sixth embodiment of the invention.
Figure 6B:
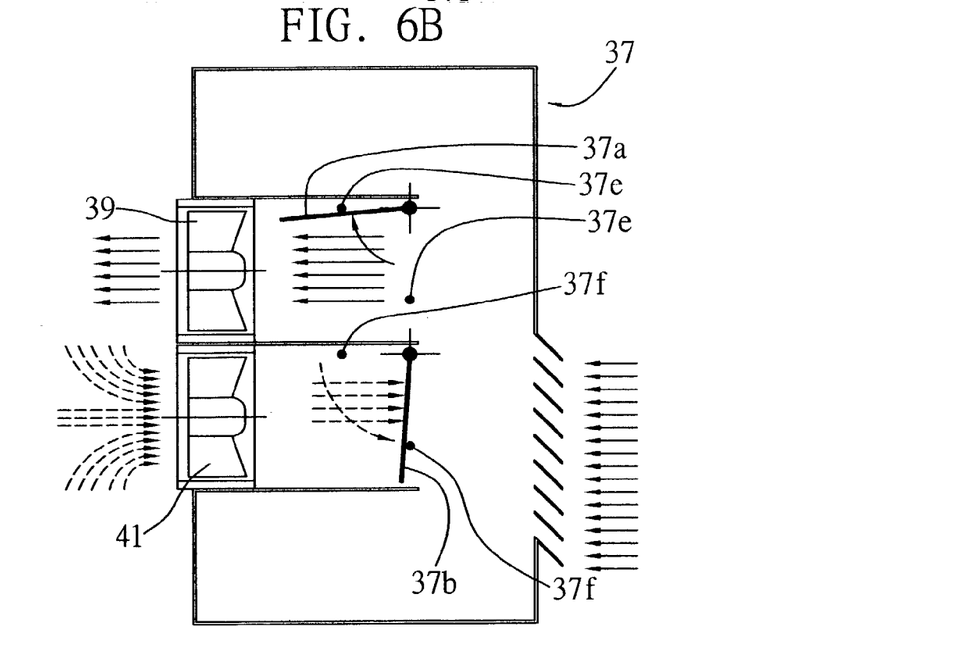
FIG. 6B is a schematic view of the flow direction control mechanism according to the sixth embodiment of the invention with a breakdown of one heat dissipating device.
Figure 6C:
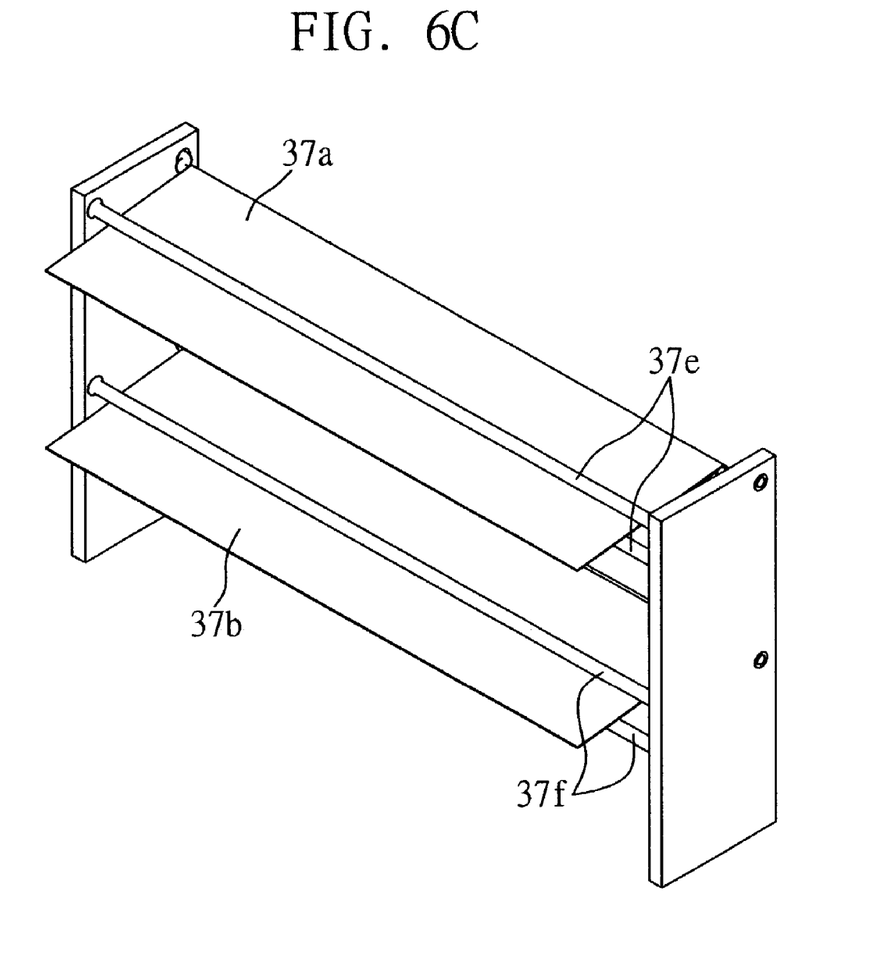
FIG. 6C is a schematic view showing part of the flow direction control mechanism according to the sixth embodiment of the invention.

FIGS. 6A to 6C illustrate a flow direction control mechanism according to a sixth embodiment of the invention. A pair of these flow direction control mechanisms 37 are pivotally installed at air outlets of the passage of the electronic device and formed with rotatable means 37a, 37b. This embodiment differs from the above second embodiment in that the flow direction control mechanisms 37 are situated at inner positions with respect to heat dissipating devices 39, 41, and the rotatable means 37a, 37b are installed on shafts, as shown in FIG. 6C.

As shown in FIGS. 6A–6C, a plurality of positioners 37e, 37f may be further provided for firmly positioning the rotatable means 37a, 37b. The positioners 37e, 37f are used to securely hold the rotatable means 37a, 37b respectively at an open position or a close position, and to eliminate noise generated from the rotatable means 37, 37b by shaking or striking during movement thereof.

The invention has been described using exemplary preferred embodiments. However, it is to be understood that the scope of the invention is not limited to the disclosed embodiments. On the contrary, it is intended to cover various modifications and similar arrangements. For examples, in the flow direction control mechanism of the invention, as shown in FIGS. 2A to 2D, the restrictors 11c, 11d, 11e, 11f may be mounted to an inner side wall of the passage of the electronic device, or a bias means or positioner may be provided on the inner side, bottom or top wall of the passage, so as to firmly hold the rotatable means at the open position or the close position, and to eliminate noise generated from the rotatable means by shaking or striking during movement thereof. The bias means provides biasing effect on the rotatable means for achieving positioning purposes; the bias means may be any a suitable elastic element e.g. a leaf spring, coil spring or twist spring.

The rotatable means may be rotatably mounted to the top or side wall of the passage of the electronic device or detachably installed on at least one suitable predetermined position in the passage.

Further, size, number, shape, arrangement and assembly of the rotatable means and restrictors may all be designed and varied according to the structure of the passage without being limited to the above mentioned embodiments.

The invention utilizes a difference in force or pressure to move the rotatable means in position without requiring an external or extra driving mechanism, so as to control a flowing direction of airflow in the passage as not to affect exhaust of heat or hot air out of the passage.

Moreover, the flow direction control mechanism according to the invention may be optionally and flexibly mounted at an air inlet or air outlet in the passage of the electronic device, and/or at positions near an air inlet or air outlet of a heat dissipation device in the electronic device. And, a plurality of the flow direction control mechanisms may integrate as a module type to be detachably mounted at suitable positions in the passage of the electronic device, so as to achieve desirable controlling effect on airflow in the passage.

Therefore, the scope of the claims should be accorded the broadest interpretation so as to encompass all similar modifications and similar arrangements under the spirits and technologies of the invention.

What is claimed is:

1. A flow direction control mechanism, comprising a plurality of rotatable means, each being disposed within one of a plurality of passages of an electronic device, with each passage including a single heat dissipating device and a single rotatable means, the single rotatable means being pushed to open the respective passage by airflow through the respective passage, the airflow being caused by operation of the respective heat dissipating device, the single rotatable means falling to close the respective passage due to gravity to prevent airflow reversal into the respective passage upon breakdown of the respective heat dissipating device, the single rotatable means having a pivoting point within the passage.

2. The flow direction control mechanism of claim 1, further comprising a plurality of biasing means, each being coupled to one of the rotatable means to bias the rotatable means toward the closed position.

3. The flow direction control mechanism of claim 1, wherein each rotatable means is rotatably mounted vertically or in parallel to the respective passage.

4. The flow direction control mechanism of claim 1, wherein each rotatable means is mounted on a top wall, side wall or bottom wall of the respective passage.

5. The flow direction control mechanism of claim 1, wherein each rotatable means is mounted in the respective passage near an air inlet or air outlet of the respective passage.

6. The flow direction control mechanism of claim 1, wherein each rotatable means is mounted outside the respective heat dissipating device near an air inlet or air outlet of the respective heat dissipating device.

7. The flow direction control mechanism of claim 1, wherein each rotatable means is made of a light material selected from the group consisting of mylar, polyester, acrylic plastic, fiber glass, resin, metal and polycarbonate.

8. The flow direction control mechanism of claim 1, wherein the single rotatable means is a flat plate.

9. The flow direction control mechanism of claim 8, wherein the pivoting point of the flat plate is at an end of the flat plate.

10. A flow direction control mechanism, comprising a plurality of rotatable means, each being disposed within one of a plurality of passages of an electronic device, with each passage including a single heat dissipating device and a single rotatable means, the single rotatable means being pushed to open the respective passage by airflow through the respective passage, the airflow being caused by operation of the respective heat dissipating device, the single rotatable means falling to close the respective passage due to gravity to prevent airflow reversal into the respective passage upon breakdown of the respective heat dissipating device, the passage extending beyond the single rotatable means when the single rotatable means closes the passage.

11. The flow direction control mechanism of claim 10, wherein the single rotatable means has a pivoting point within the passage.

12. The flow direction control mechanism of claim 11, wherein the single rotatable means is a flat plate.

13. The flow direction control mechanism of claim 12, wherein the pivoting point of the flat plate is at an end of the flat plate.

* * * * *